(12) United States Patent
Tseng et al.

(10) Patent No.: US 11,527,671 B2
(45) Date of Patent: Dec. 13, 2022

(54) OPTICAL PACKAGE STRUCTURE AND METHOD OF MANUFACTURING THE SAME

(71) Applicant: Advanced Semiconductor Engineering, Inc., Kaohsiung (TW)

(72) Inventors: Chi Sheng Tseng, Kaohsiung (TW); Hui-Chung Liu, Kaohsiung (TW); Ching-Han Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 242 days.

(21) Appl. No.: 16/732,161

(22) Filed: Dec. 31, 2019

(65) Prior Publication Data

US 2021/0202780 A1    Jul. 1, 2021

(51) Int. Cl.
*H01L 31/12* (2006.01)
*H01L 31/18* (2006.01)
*H01L 31/153* (2006.01)

(52) U.S. Cl.
CPC .......... *H01L 31/125* (2013.01); *H01L 31/153* (2013.01); *H01L 31/1804* (2013.01)

(58) Field of Classification Search
CPC . H01L 31/125; H01L 31/153; H01L 31/1804; H01L 25/167; H01L 31/165; H01L 31/0203; H01L 27/14618; H01L 27/14634; H01L 27/14636; H01L 31/02005; G01S 7/4813; G01S 17/08
See application file for complete search history.

(56) References Cited

U.S. PATENT DOCUMENTS

2019/0305170 A1*  10/2019  Nakamoto ............. H01L 31/12
2020/0168757 A1*   5/2020  Lin ....................... G01J 3/0256

\* cited by examiner

*Primary Examiner* — Hoang-Quan Ho
(74) *Attorney, Agent, or Firm* — Foley & Lardner LLP

(57) ABSTRACT

An optical package structure includes a substrate, an emitter, a first detector and a light-absorption material. The substrate has a first surface and a second surface opposite to the first surface, the substrate includes a via defining a third surface extending from the first surface to the second surface. The emitter is disposed on the first surface of the substrate. The first detector is disposed on the first surface and aligned with the via of the substrate. The light-absorption material is disposed on the third surface of the substrate.

16 Claims, 20 Drawing Sheets

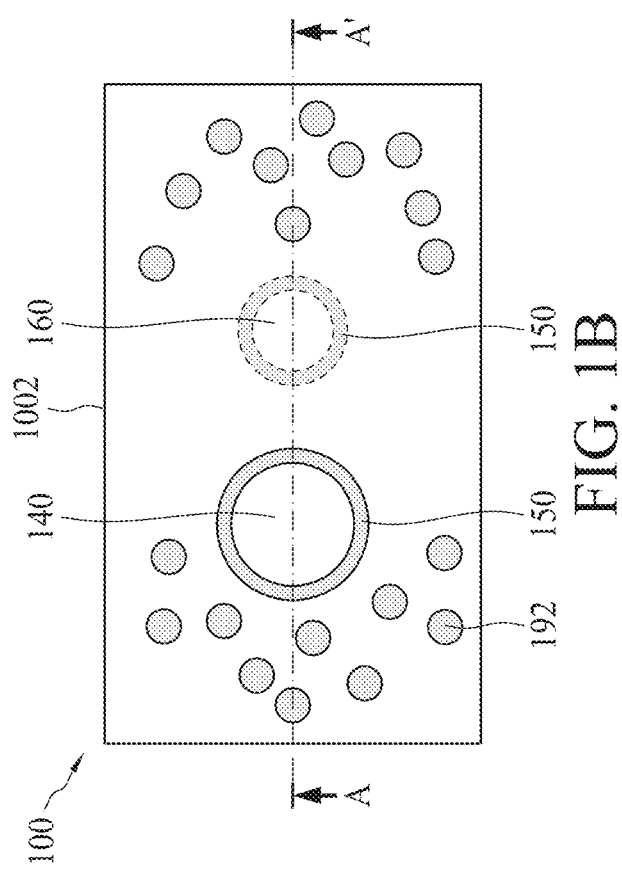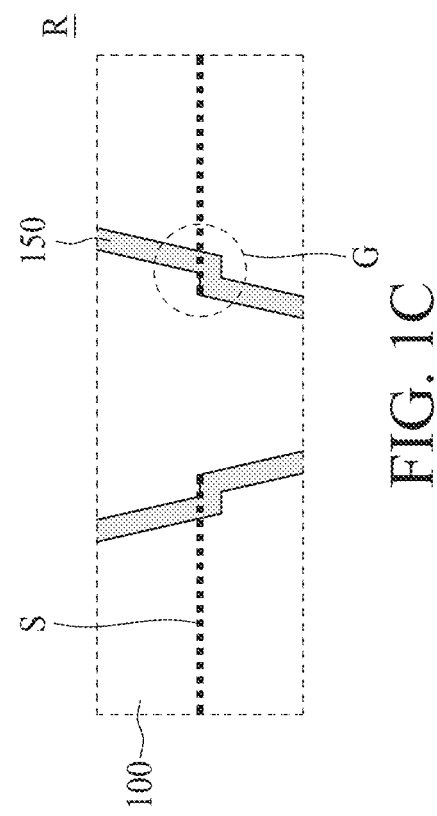

OPTICAL PACKAGE STRUCTURE AND METHOD OF MANUFACTURING THE SAME

BACKGROUND

1. Field of the Disclosure

The present disclosure relates to an optical package structure and a method of manufacturing the same.

2. Description of Related Art

As technology of semiconductor assemblies, such as an optical sensor structures, has been improved, the size of the semiconductor assemblies becomes much smaller. Generally, an optical package including one or more Time of Flight (ToF) sensors may utilize an organic substrate and a clear compound or plastic lid covering optical elements on the organic substrate or defining an optical path for such optical elements. However, said optical package possesses at least a thickness of 1 mm which may be too thick for some applications. In addition, applying multiple materials with different characteristics in the optical package may induce substrate warpage due to coefficient of thermal expansion (CTE) mismatch. Therefore, it is desirable to reduce the thickness and resolve substrate warpage in order to cater to applications specifying a sufficiently thin optical package structure.

SUMMARY

According to some embodiments of the present disclosure, an optical package structure includes a substrate, an emitter, a first detector and a light-absorption material. The substrate has a first surface and a second surface opposite to the first surface, the substrate includes a via defining a third surface extending from the first surface to the second surface. The emitter is disposed on the first surface of the substrate. The first detector is disposed on the first surface and aligned with the via of the substrate. The light-absorption material is disposed on the third surface of the substrate.

According to some embodiments of the present disclosure, an optical package structure includes a substrate, a blind hole, a light absorption material, an emitter and a first detector. The substrate has a first surface, a second surface opposite to the first surface. The blind hole is recessed from the first surface, and defines a third surface. The light absorption material is disposed on the third surface. The emitter is disposed on the first surface of the substrate. The first detector is disposed on the first surface. A light-receiving region of the first detector is aligned with the blind hole.

According to some embodiments of the present disclosure, a method of manufacturing an optical package structure includes: providing a first substrate having a first surface and a second surface opposite to the first surface; patterning the first substrate to form an opening and a first through hole; filling a light absorption material into the opening and the first through hole; removing a portion of the light absorption material from the first through hole by a drilling operation; disposing an emitter on the first surface of the first substrate; and disposing a first detector on the first surface of the first substrate by aligning the first detector to the first through hole.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 1B is a top view of the optical package structure illustrated in FIG. 1A in accordance with some embodiments of the present disclosure.

FIG. 1C is an enlarged view of a portion of the optical package structure illustrated in FIG. 1A in accordance with some embodiments of the present disclosure.

Figure 1A:
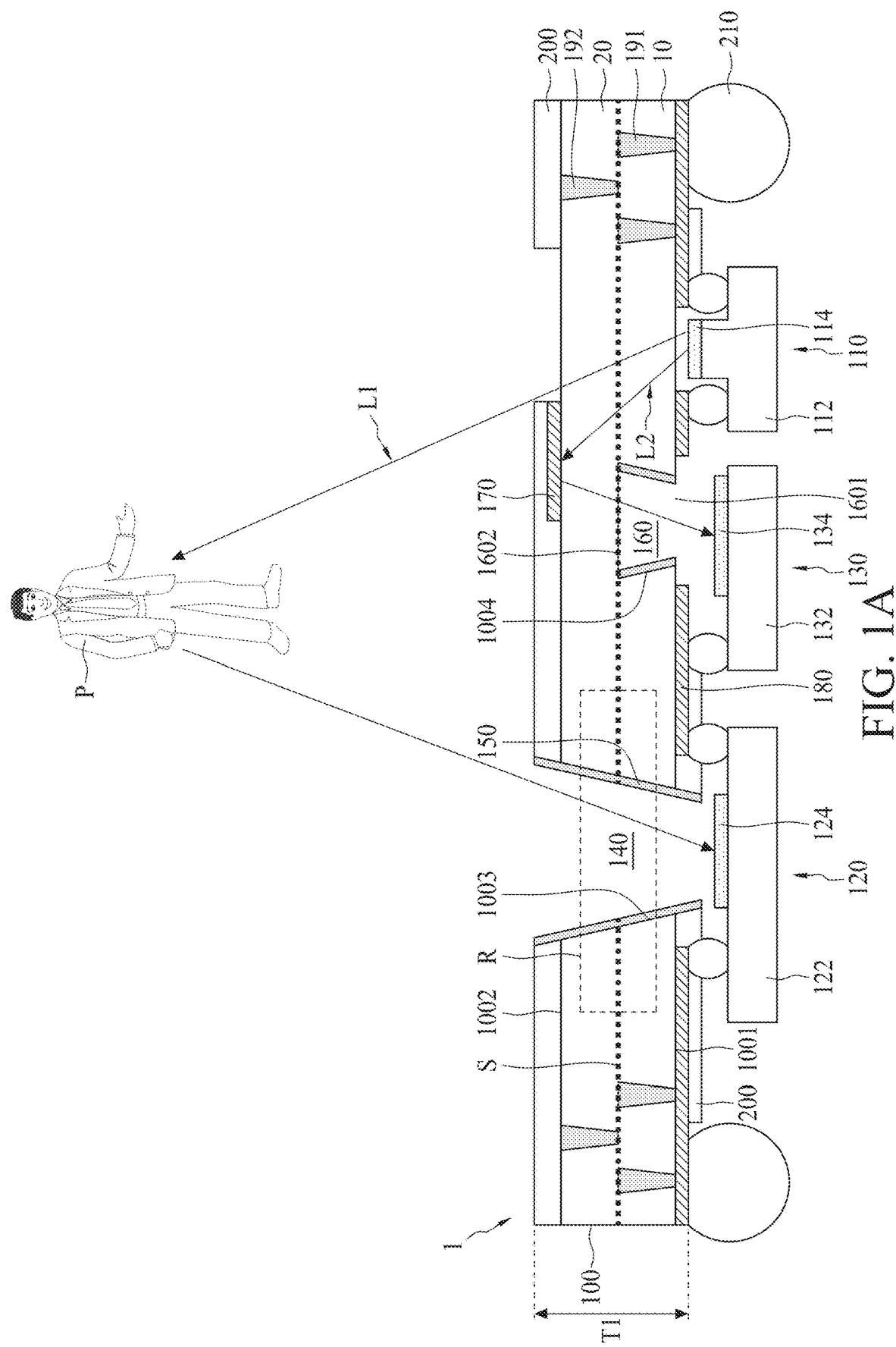
FIG. 1A is a cross-sectional view of an optical package structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A is a cross-sectional view of an optical package structure 1 in accordance with some embodiments of the present disclosure. As shown in FIG. 1A, the optical package structure 1 includes a substrate 100, an emitter 110, and a detector 120.

In some embodiments, the substrate 100 is a transparent substrate. More specifically, the substrate 100 is transparent to a peak wavelength of light emitted by the emitter 110. In some embodiments, the substrate 100 may have a transmittance exceeding 90% to a peak wavelength of the light emitted by the emitter 110; the substrate 100 may have a transmittance exceeding 95% to a peak wavelength of the light emitted by the emitter 110; and the substrate 100 may have a transmittance exceeding 98% to a peak wavelength of the light emitted by the emitter 110.

In some embodiments, the substrate 100 includes a glass substrate. In some embodiments, the substrate 100 includes a sapphire substrate or other suitable substrate(s). The substrate 100 may have a surface 1001 and a surface 1002 opposite to the surface 1001. The surface 1001 may be substantially parallel to the surface 1002. The substrate 100 has a thickness T1. In some embodiments, the thickness T1 is in a range from about 0.3 mm to about 0.5 mm. In some embodiments, the thickness T1 is in a range from about 0.5 mm to about 0.7 mm. In some embodiments, the thickness T1 is in a range from about 0.7 mm to about 0.9 mm.

In some embodiments, the substrate 100 includes a first portion 10 and a second portion 20 (can also be referred to as a first substrate and a second substrate herein, respectively). In some embodiments, an boundary S (or interface) is formed between the first portion 10 and the second portion 20.

In some embodiments, the emitter 110 is disposed on the surface 1001 of the substrate 100. The emitter 110 is configured to emit light, such as lights L1 and L2, toward a target object P. In some embodiments, the emitter 110 includes a light-emitting device (LED). The emitter 110 may have a semiconductor substrate 112 and a light-emitting region 114 on, adjacent to, or exposed from the semiconductor substrate 112. The semiconductor substrate 112 may include a silicon substrate or other suitable substrate(s). Some active elements and passive elements (not shown) are formed on or in the semiconductor substrate 112. The light-emitting region 114 may include, but is not limited to, a blue pixel, a green pixel, a red pixel, an infrared (IR) pixel, an ultraviolet (UV) pixel, which can emit light of different wavelengths.

In some embodiments, the emitter 110 can emit light with wavelength from about 390 nm to about 780 nm. In some embodiments, the emitter 110 can emit light with wavelength from about 780 nm to about 3000 nm. In some embodiments, the emitter 110 can emit light with wavelength from about 100 nm to about 390 nm. The emission wavelength of the emitter 110 in the present disclosure may be adapted for suitable applications.

In some embodiments, the detector 120 is disposed on the surface 1001 of the substrate 100. The detector 120 is configured to receive light, such as light L1, reflected from the target object P. In some embodiments, the detector 120 may include, but is not limited to, a photo detector and/or other elements that can convert optical signals to electrical signals. The detector 120 may have a semiconductor substrate 122 and a light-receiving region 124 on, adjacent to, or exposed from the semiconductor substrate 122. The semiconductor substrate 122 includes a silicon substrate or other suitable substrate(s). Some active elements and passive elements (not shown) are formed on or in the semiconductor substrate 122. The light-receiving region 124 may include a photodiode or other suitable element(s).

In some embodiments, the optical package structure 1 includes a detector 130 disposed on the surface 1001 of the substrate 100. The detector 130 is configured to receive light, such as light L2, emitted from the emitter 110. In some embodiments, the detector 120 may include, but is not limited to, a photo detector and/or other elements that can convert light signals to electrical signals. The detector 130 may have a semiconductor substrate 132 and a light-receiving region 134 on, adjacent to, or exposed from the semiconductor substrate 132. The semiconductor substrate 132 includes a silicon substrate or other suitable substrate(s). Some active elements and passive elements (not shown) are formed on or in the semiconductor substrate 132. The light-receiving region 134 may include a photodiode or other suitable element(s). In some embodiments, the detector 130 is disposed between the emitter 110 and the detector 120.

As shown in FIG. 1A, the light L1 and light L2 emitted by the emitter 110 may travel different optical paths. The light L1 is incident on the target object P and then reflected to the detector 120. The light L2 is incident on a light-reflecting layer 170 of the optical package structure 1 and then reflected to the detector 130. Since the optical path of light L2 is substantially fixed, the time of the light L2 being received by the detector 120 can be set as a reference value. Time differential between the detector 120 and the detector 130 receiving the lights L1 and L2, respectively, can determine the distance of the target object P with respect to the optical package structure 1.

In some embodiments, the substrate 100 has a via 140. The via 140 penetrates the substrate 100 from the surface 1001 to the surface 1002. The via 140 defines a surface 1003 that extends from the surface 1001 to the surface 1002. In some embodiments, an inclusive angle between the surface 1003 and the surface 1001 is in a range from about 45° to about 60°. In some embodiments, inclusive angle between the surface 1003 and the surface 1001 is in a range from about 60° to about 75°. In some embodiments, an inclusive angle between the surface 1003 and the surface 1001 is in a range from about 75° to about 90°. In some embodiments, the via 140 is aligned with the light-receiving region 124 of the detector 120. In some embodiments, the aperture of the via 140 on the surface 1001 is smaller than the aperture of the via on the surface 1002.

From a top view, such as shown in FIG. 1B, the via 140 may have a circular shape. In other embodiments, the via 140 may have other profiles, such as oval, rectangular, or other suitable profile(s).

In some embodiments, the optical package structure 1 includes a light-absorption material 150. The light-absorption material 150 is disposed on the surface 1003. The light-absorption material 150 may be conformally disposed on the surface 1003. The light-absorption material 150 may extend from the surface 1001 to the surface 1002. In some embodiments, the light-absorption material 150 is free from filling a center portion of the via 140 so that the detector 120 can receive light reflected from the target object P. In some embodiments, the light-absorption material 150 includes a material that can absorb light emitted from the emitter 110.

In some embodiments, the light-absorption material 150 can receive specific wavelengths of light, such as visible light, IR, UV or a combination thereof. For example, the light-absorption material 150 may include black photoresist, black ink, black polymer or other suitable material(s).

In some embodiments, the light-absorption material 150 may have an absorbance exceeding 90% to a peak wavelength of the light emitted by the emitter 110; the light-absorption material 150 may have an absorbance exceeding 95% to a peak wavelength of the light emitted by the emitter 110; and the light-absorption material 150 may have an absorbance exceeding 98% to a peak wavelength of the light emitted by the emitter 110.

In some embodiments, the substrate 100 has a blind hole 160 recessed from the surface 1001. The blind hole 160 has an open end 1601 on the surface 1001. The blind hole 160 has a closed end 1602 opposite to the open end 1601. In some embodiments, the closed end 1602 aligns with the boundary S (or interface) of the substrate 100. The light-receiving region 134 of the detector 130 is aligned with the blind hole 160. The light-receiving region 134 of the detector 130 is exposed from the via 140. In some embodiments, the aperture of the blind hole 160 at the open end 1601 is smaller than the aperture of the blind hole 160 at the closed end 1602. In addition, the substrate 100 has a surface 1004 extending from the open end 1601 to the closed end 1602. The light-absorption material 150 is disposed on the surface 1004. The light-absorption material 150 is free from filling a center portion of the blind hole 160.

In some embodiments, the optical package structure 1 includes a light-reflecting layer 170. The light-reflecting layer 170 is disposed on the surface 1002. The light-reflecting layer 170 is configured to reflect light emitted from the emitter 110 to the detector 130. The light-reflecting layer 170 may include material that can reflect light, such as metal or other suitable material(s). In some embodiments, the light-reflecting layer 170 partially overlaps the detector 130 and the emitter 110. In some embodiments, the projection of the light-reflecting layer 170 on the surface 1001 is located between the emitter 110 and the detector 130.

The optical package structure 1 includes a conductive layer 180. The conductive layer 180 is disposed on the surface 1001 of the substrate 100. The conductive layer 180 is configured to electrically connect the emitter 110, the detector 120 and/or the detector 130 to other element(s), such as bumps 210. The conductive layer 180 may include metal or other suitable material(s). The metal may include copper, copper alloy, iron, nickel, iron alloy, nickel alloy or any other suitable metal or metal alloy.

In some embodiments, the optical package structure 1 includes a plurality of light-blocking structures 191 and light-blocking structures 192. The light-blocking structures 191 may extend from the surface 1001 of the substrate 100. The light-blocking structures 192 may extend from the surface 1002 of the substrate 100. In some embodiments, the light-blocking structures 191 extends from the surface 1001 toward the boundary S and terminates at the boundary S. In some embodiments, the light-blocking structures 192 extends from the surface 1002 toward the boundary S and terminates at the boundary S. The light-blocking structures 191 and/or the light-blocking structures 192 can surround the emitter 110, the detector 120 and/or the detector 130. The light-blocking structures 191 and/or the light-blocking structures 192 are configured to prevent the detector 120 and/or the detector 130 from receiving undesired light (e.g., environmental light). In some embodiments, the material of the light-blocking structures 191 and/or the light-blocking structures 192 may be the same as that of the light-absorption material 150. In some embodiments, the material of the light-blocking structures 191 and/or the light-blocking structures 192 may be different from that of the light-absorption material 150.

In some embodiments, each of the light-blocking structures 191 has a larger aperture at a closed end of the light-blocking structures 191 and a smaller aperture on the surface 1001. In some embodiments, each of the light-blocking structures 192 has a larger aperture at the surface 1002 and a smaller aperture at a closed end of the light-blocking structures 192.

In some embodiments, the optical package structure 1 includes a solder mask 200. The solder mask 200 is disposed on the surface 1001 and on the surface 1002 of the substrate 100. The solder mask 200 covers a portion of the conductive layer 180. The solder mask 200 covers the light-reflecting layer 170. The solder mask 200 can be patterned so that the solder mask 200 has openings allowing light to pass therethrough.

In some embodiments, the optical package structure 1 includes a plurality of bumps 210. The bumps 210 can be mounted on the surface 1001 substrate 100. The bumps 210 are configured to electrically connect the emitter 110, the detector 120 and/or the detector 130 to other elements (not shown), such as a printed circuit board (PCB). The bump 210 can include a solder ball (e.g., Sn ball).

In some embodiments, the detector 130 is disposed between the detector 120 and the emitter 110. In other embodiments, the emitter 110 is disposed between the detector 120 and the detector 130, and the blind hole 160 is aligned with the light-receiving region 134 of the detector 130.

FIG. 1B is a top view of the optical package structure 1 illustrated in FIG. 1A, and FIG. 1A is a cross-sectional view across line A-A' of FIG. 1B. Some elements are omitted from FIG. 1B for brevity.

The light-blocking structures 192 surround the via 140 and/or the blind hole 160. In some embodiments, from a top view, such as shown in FIG. 1B, the light-blocking structures 192 may have a circular shape. In other embodiments, the light-absorption material 150, located within the via 140 or the blind hole 160 of the substrate 100, may be annular.

Referring to FIG. 1C, FIG. 1C is an enlarged view of a region R of the optical package structure 1 in accordance with some embodiments of the present disclosure as illustrated in FIG. 1A.

Since the substrate 100 includes two portions or two substrates bonded face to face, a step difference at the boundary S of the first portion 10 and the second portion 20 may be observed depending on the alignment capability of the bonding process. In some embodiments, the step difference is in a range from about 1 μm to about 3 μm; the step difference is in a range from about 3 μm to about 5 μm; the step difference is in a range from about 5 μm to about 7 μm; or the step difference is in a range from about 7 μm to about 9 μm;

Compared to traditional optical package structures, the embodiments of the present disclosure use a substrate, such as a glass substrate, to replace the organic substrate, which can omit the formation of clear compound and/or lid. Accordingly, the thickness of the optical package structure can be reduced. In some embodiments according to the present disclosure, the optical package structure includes a light-absorption material disposed on a surface defined by a via of the substrate, which can prevent undesired light being incident on detector(s). In some embodiments according to the present disclosure, the optical package structure includes a plurality of light-blocking structures. The light-blocking structures surround the emitter and the detector, which further prevent undesired light being incident on detectors. In some embodiments according to the present disclosure, the via of the substrate has a smaller aperture on a side close to the detector and a larger aperture on the other side, which assists the detector in receiving more light and thus the sensitivity of the optical package structure can be improved. In some embodiments according to the present disclosure, the blind hole of the substrate has a smaller aperture at an open end and a larger aperture at a closed end, which assists the detector in receiving more light and thus the sensitivity of the optical package structure can be improved.

Figure 2:
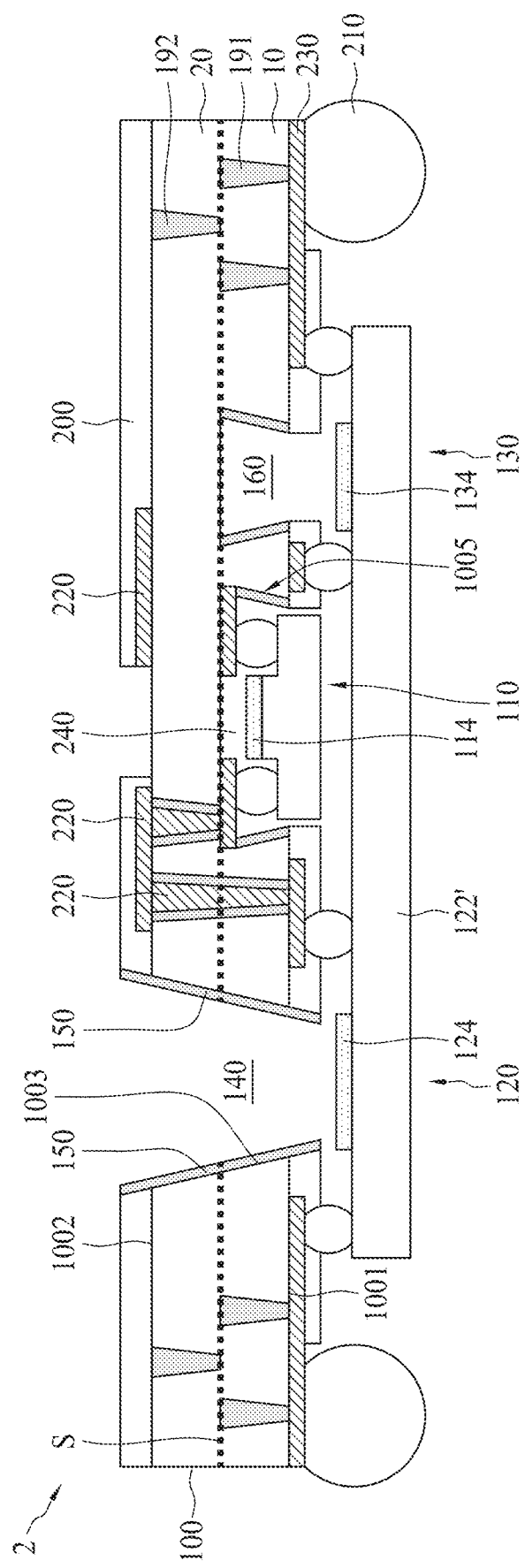
FIG. 2 is a cross-sectional view of another optical package structure in accordance with some embodiments of the present disclosure.

FIG. 2 is a cross-sectional view of an optical package structure 2 in accordance with some embodiments of the present disclosure. The optical package structure 2 of FIG. 2 has a structure similar to that of the optical package structure 1 of FIG. 1A except that the optical package structure 2 further includes a cavity 240.

In some embodiments, the cavity 240 is recessed from the surface 1001. The cavity 240 is configured to accommodate the emitter 110. The cavity 240 has an open end on the surface 1001 and a closed end at the boundary S between the first portion 10 and the second portion 20. In some embodiments, the aperture of the cavity 240 at the open end is smaller than that at the closed end. In some embodiments, the cavity 240 defines a surface 1005 extending from the open end to the closed end of the cavity 240. The light-absorption material 150 is disposed on the surface 1005.

In addition, the optical package structure 2 includes conductive layers 220 and 230. The conductive layers 220 and 230 are configured to electrically connect the emitter 110 to another element, such as bumps. The conductive layers 220 and 230 may include metal or other suitable material(s). The metal may include copper, copper alloy, iron, nickel, iron alloy, nickel alloy or any other suitable metal or metal alloy. In addition, a portion of the metal layer 220 may be used as a light-reflecting layer to reflect light emitted from the emitter 110 to the detector 130.

In some embodiments, the light-receiving region 124 of the detector 120 and the light-receiving region 134 of the detector 130 are on, adjacent to, or exposed from a common semiconductor substrate 122'. That is, the detector 120 and the detector 130 share a common substrate.

In some embodiments according to the present disclosure, the optical package structure includes a cavity on which the emitter is disposed. Accordingly, the thickness of the optical package structure is further reduced.

Figure 3:
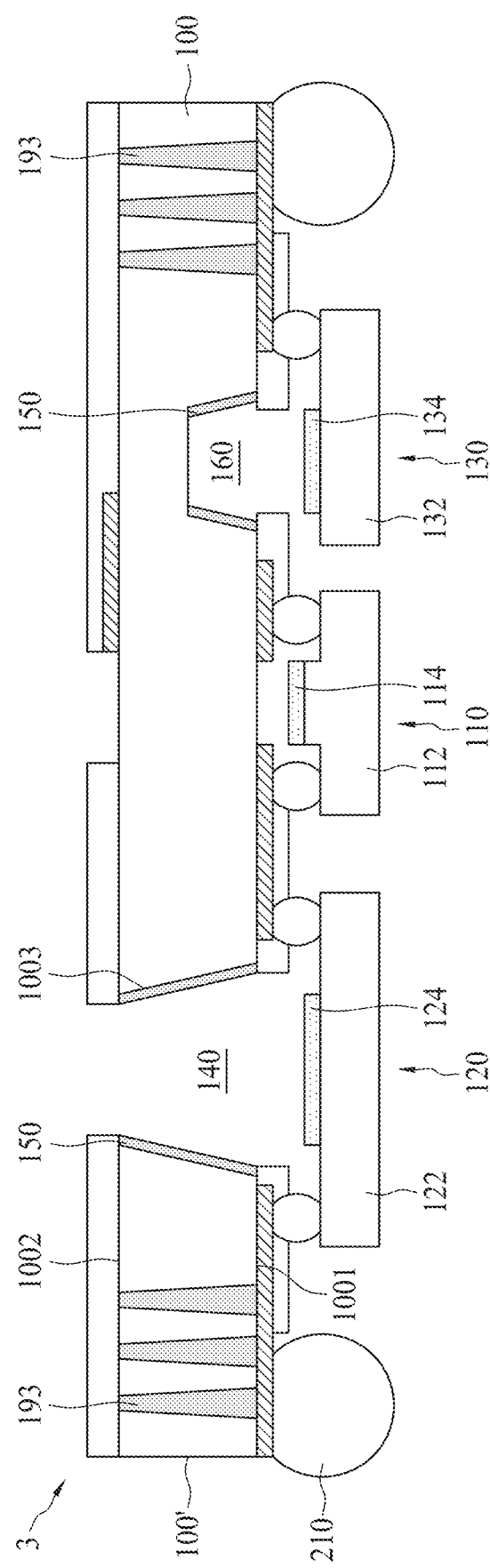
FIG. 3 is a cross-sectional view of another optical package structure in accordance with some embodiments of the present disclosure.

FIG. 3 is a cross-sectional view of an optical package structure 3 in accordance with some embodiments of the present disclosure. The optical package structure 3 of FIG. 3 has a structure similar to that of the optical package structure 1 of FIG. 1A except that the optical package structure 3 includes a single substrate 100' rather than a stacked substrate 100 of FIG. 1A.

In some embodiments, the substrate 100' is composed of a single substrate. In some embodiments, there is no boundary formed within the substrate 100'. The substrate 100' has a thickness T2. In some embodiments, the thickness T2 is in a range from about 0.1 mm to about 0.3 mm; the thickness T2 is in a range from about 0.3 mm to about 0.5 mm; the thickness T2 is in a range from about 0.5 mm to about 0.7 mm; the thickness T2 is in a range from about 0.7 mm to about 0.9 mm.

In some embodiments, the optical package structure 3 includes a plurality of light-blocking structures 193. The light-blocking structures 193 extend from the surface 1001 of the surface 1002. The light-blocking structures 193 can surround the emitter 110, the detector 120 and/or the detector 130. The light-blocking structures 193 are configured to prevent undesired light (e.g., environmental light) reaching the detector 120 and/or the detector 130. In some embodiments, the material of the light-blocking structures 193 is the same as that of the light-absorption material 150. In some embodiments, the material of the light-blocking structures 193 is different from that of the light-absorption material 150.

In some embodiments, the apertures of the light-blocking structures 193 on the surface 1001 are larger than the apertures of the light-blocking structures 193 on the surface 1002. In some embodiments, the aperture of the via 140 on the surface 1001 is larger than the aperture of the via 140 on the surface 1002. In some embodiments, the aperture of the blind hole 160 on the open end 1601 is larger than the aperture of the blind hole 160 on the closed end 1602. In some embodiments, the emitter 110 is disposed between the detector 120 and the detector 130.

In some embodiments according to the present disclosure, the optical package structure 3 is formed of one substrate, which can further reduce the thickness of the optical package structure.

Figure 4:
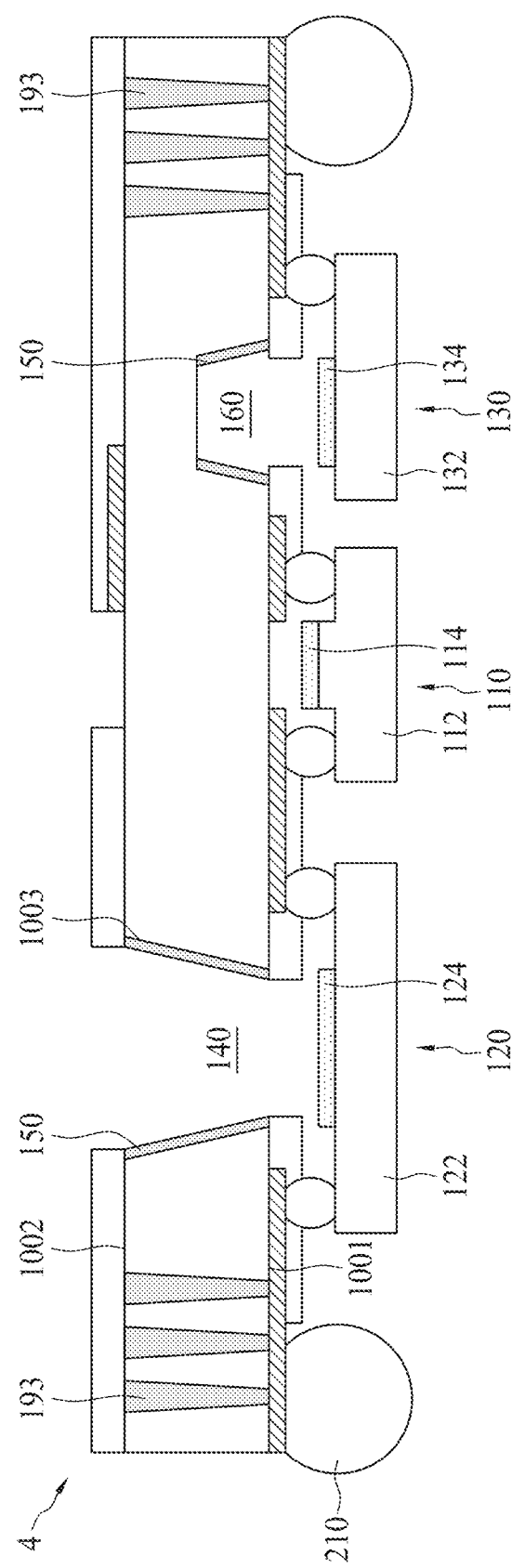
FIG. 4 is a cross-sectional view of another optical package structure in accordance with some embodiments of the present disclosure.

FIG. 4 is a cross-sectional view of an optical package structure 4 in accordance with some embodiments of the present disclosure. The optical package structure 4 of FIG. 4 has a structure similar to that of the optical package structure 3 of FIG. 3 except for the respective aperture size of the via 140 at the surfaces 1001, 1002, and/or the respective aperture sizes of the light-blocking structures 193 at the surfaces 1001, 1002.

In some embodiments, the aperture of the via 140 on the surface 1001 is less than the aperture of the via 140 on the surface 1002. In some embodiments, the aperture of the light-blocking structures 193 on the surface 1001 is less than the aperture of the light-blocking structures 193 on the surface 1002.

Figure 5:
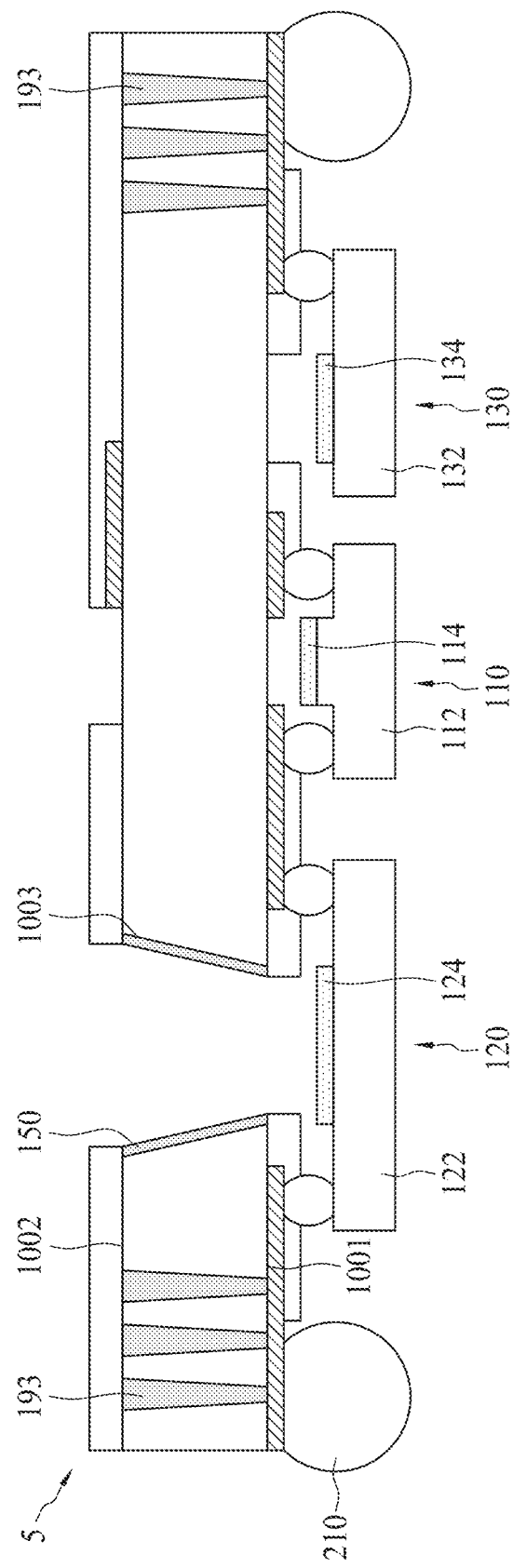
FIG. 5 is a cross-sectional view of another optical package structure in accordance with some embodiments of the present disclosure.

FIG. 5 is a cross-sectional view of an optical package structure 5 in accordance with some embodiments of the present disclosure. The optical package structure 5 of FIG. 5 has a structure similar to that of the optical package structure 4 of FIG. 4 except that the optical package structure 5 does not have a blind hole.

In some embodiments according to the present disclosure, a blind hole can be omitted, which assists in simplifying the process of the manufacturing the optical package structure.

FIG. 6A, FIG. 6B, FIG. 6C, FIG. 6D, FIG. 6E, FIG. 6F and FIG. 6G illustrate various stages of a method for manufacturing the optical package structure 1 in accordance with some embodiments of the present disclosure.

Figure 6A:
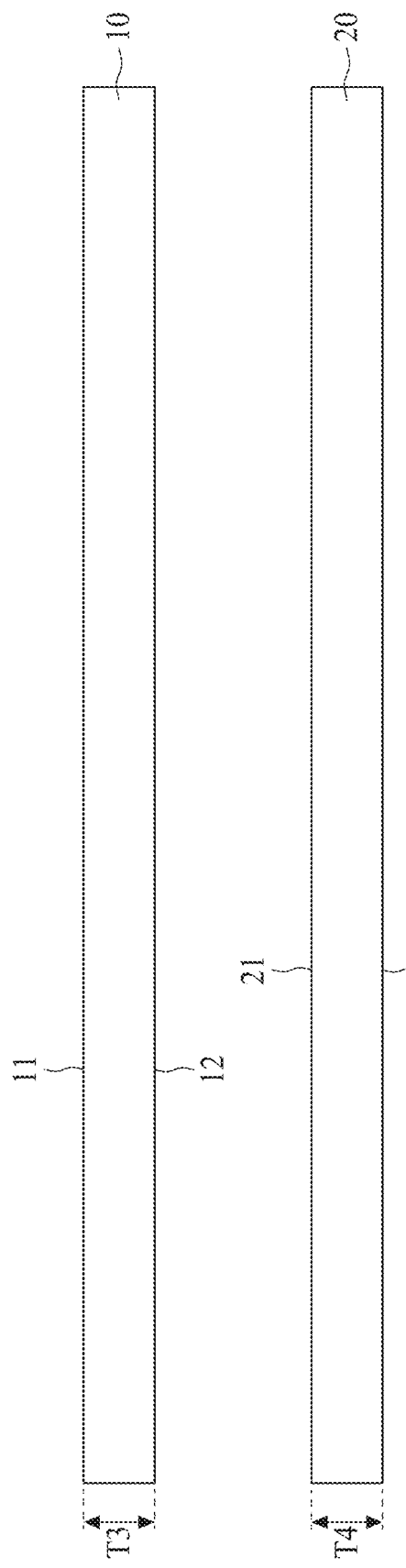
FIG. 6A, FIG. 6B, FIG. 6C, FIG. 6D, FIG. 6E, FIG. 6F and FIG. 6G illustrate various stages of a method for manufacturing an optical package structure in accordance with some embodiments of the present disclosure.

Referring to FIG. 6A, a first portion 10 (or first substrate) and a second portion 20 (or second substrate) are provided. The first portion 10 has a surface 11 and a surface 12 opposite to the surface 11. The second portion 20 has a surface 21 and a surface 22 opposite to the surface 21. In some embodiments, the material of the first portion 10 is the same as that of the second portion 20. In some embodiments, the material of the first portion 10 is different from that of the second portion 20. The first portion 10 has a thickness T3. In some embodiments, the thickness T3 is in a range from about 0.1 mm to about 0.2 mm; the thickness T3 is in a range from about 0.2 mm to about 0.3 mm; the thickness T3 is in a range from about 0.3 mm to about 0.4 mm; or the thickness T3 is in a range from about 0.4 mm to about 0.5 mm. The second portion 20 has a thickness T4. In some embodiments, the thickness T4 is in a range from about 0.1 mm to about 0.2 mm; the thickness T4 is in a range from about 0.2 mm to about 0.3 mm; or the thickness T4 is in a range from about 0.3 mm to about 0.4 mm. In some embodiments, the thickness T3 is different from the thickness T4. In some embodiments, the thickness T3 is the same as the thickness T4.

Figure 6B:
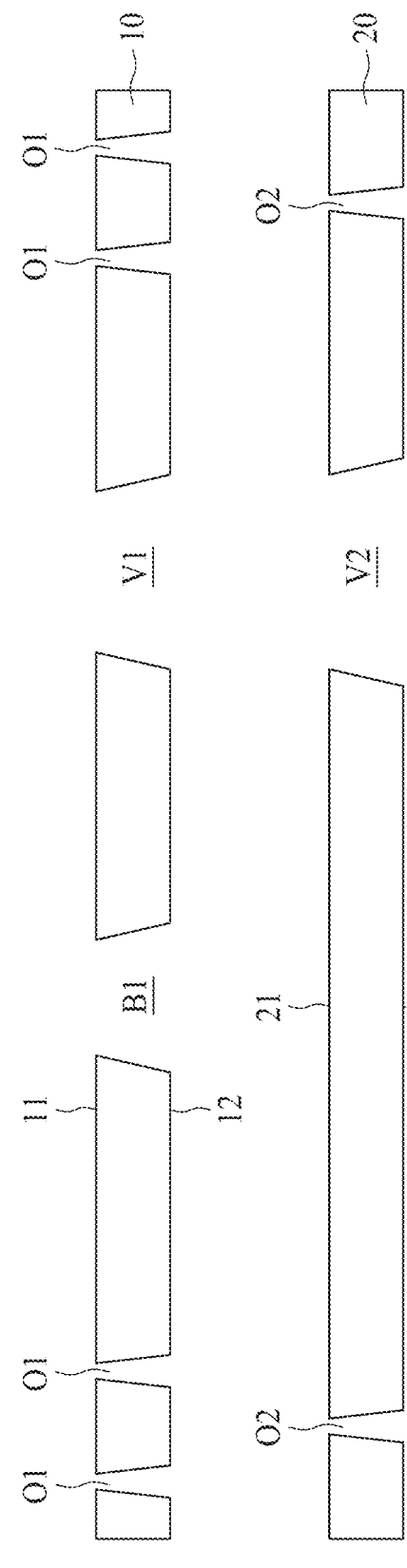

Referring to FIG. 6B, a patterning process is performed on the first portion 10 to form a plurality of openings O1, a through hole B1 and a through hole V1. The openings O1 the through holes B1 and V1 extend from the surface 11 to the surface 12. Furthermore, another patterning process is performed on the second portion 20 to form a plurality of openings O2 and a through hole V2. The openings O2 and the through hole V2 extend from the surface 21 to the surface 22.

In some embodiments, a carrier substrate (not shown) is provided, and the first portion 10 is disposed on the carrier substrate. The surface 11 facing and supported by the carrier substrate. A patterning process, for example, a mechanical drilling operation, a laser drilling operation, or an etching operation, is performed on the surface 12. When a laser drilling operation is performed, a tapered cross section can be observed so that each of the openings O1, the through holes B1 and V1 has a larger aperture on the surface 12 and a smaller aperture on the surface 11. In some embodiments, another carrier substrate (not shown) is provided, on which the second portion 20 is disposed. The surface 21 facing and supported by the carrier substrate, and an patterning process, for example, a mechanical drilling operation, a laser drilling operation, or an etching operation, is performed on the surface 22. When a laser drilling operation is performed, a tapered cross section can be observed so that each of the openings O2 and the through hole V2 has a larger aperture on the surface 22 and a smaller aperture on the surface 21. In some embodiments, the aperture of the first portion 10 on the surface 12 is substantially the same size as the aperture of the second portion 20 on the surface 21.

Figure 6C:
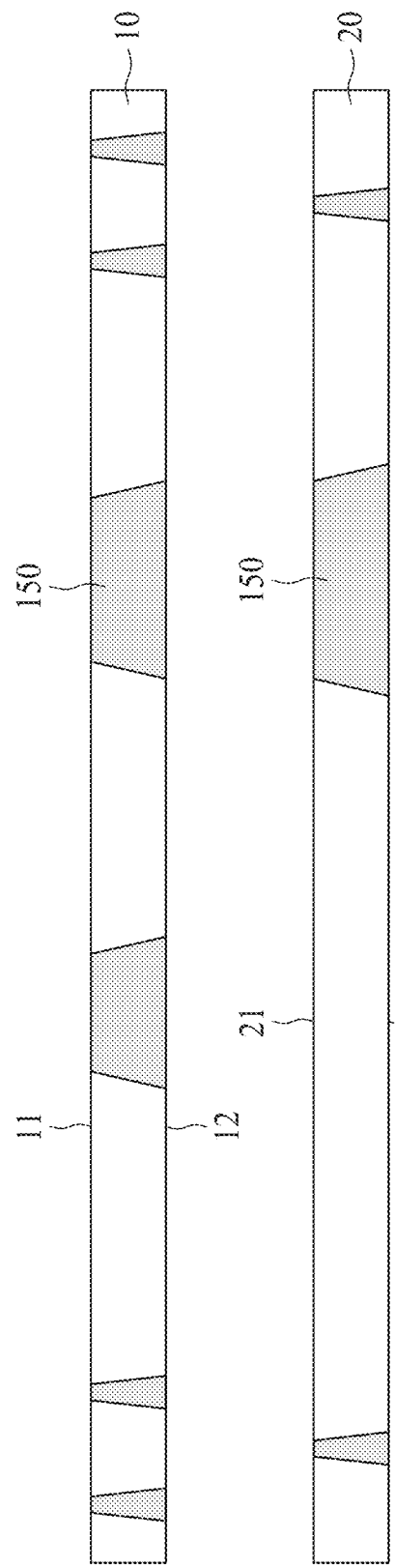

Referring to FIG. 6C, a light-absorption material 150 is filled into the openings O1, the through holes B1 and V1; the light-absorption material 150 is filled into the openings O2 and the through hole V2.

Figure 6D:
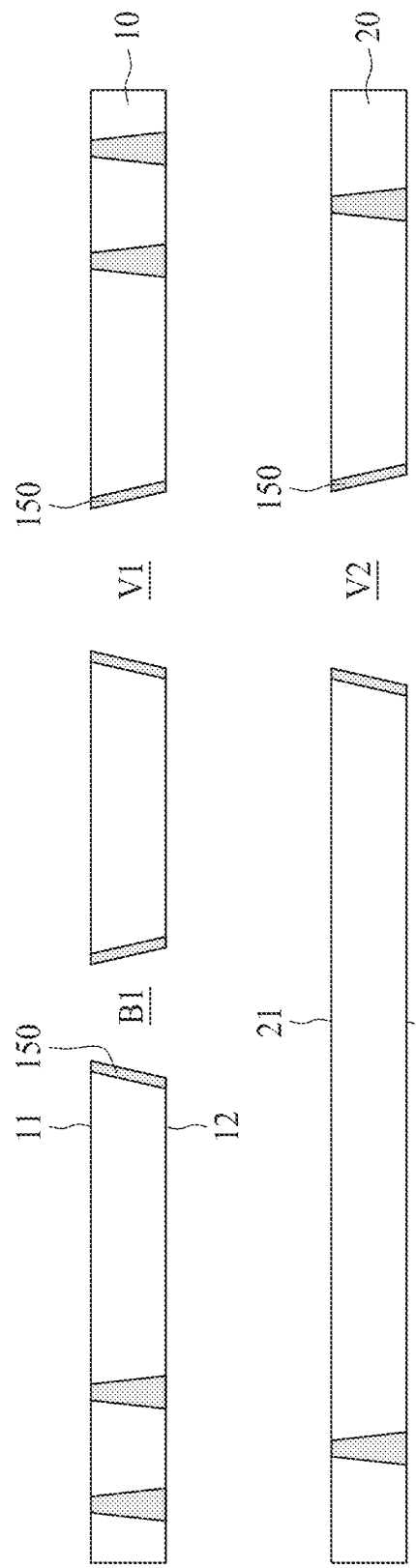

Referring to FIG. 6D, a portion of the light-absorption material 150 in the through holes B1 and V1 is removed, such as by a drilling operation. A portion of the light-absorption material 150 remains on the surfaces defined by the through holes B1 and V1. A portion of the light-absorption material 150 in the through hole V2 is removed by a drilling operation. A portion of the light-absorption material 150 remains on the surface defined by the through hole V2.

Figure 6E:
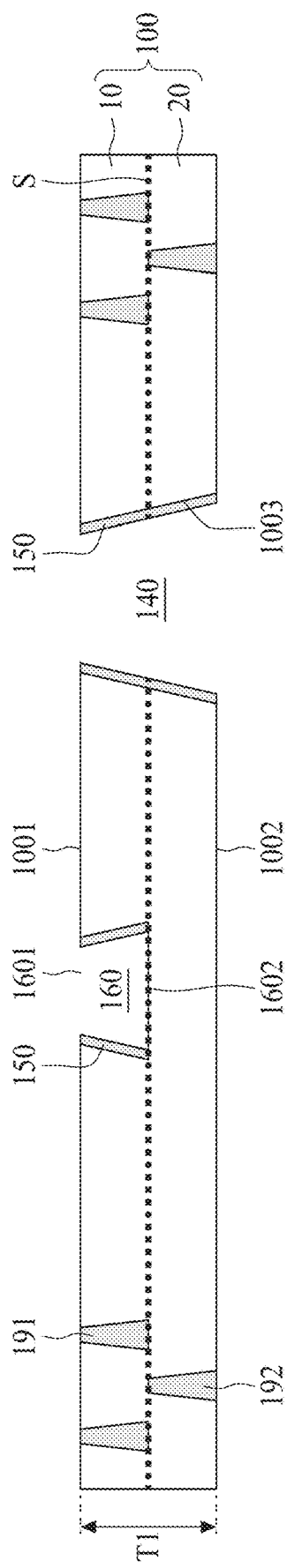

Referring to FIG. 6E, the first portion 10 and the second portion 20 are bonded to form the substrate 100, or a stacked substrate referred herein. In some embodiments, the first portion 10 and the second portion 20 are bonded by glass micro-bonding, which uses laser illumination aiming at the boundary S of the first portion 10 and the second portion 20 so as to coalesce the first portion 10 and the second portion 20. In some embodiments, the first portion 10 and the second portion 20 are bonded by an adhesive material, such as a resin or other suitable material(s). The surface 12 of the first portion 10 is attached to the surface 21 of the second portion 20, and a boundary S is formed between the first portion 10 and the second portion 20. The surface 11 can correspond to the surface 1001 of the substrate 100 and the surface 22 can correspond to the surface 1002 of the substrate 100. The through holes V1 and V2 form a via 140. The through hole B1 forms a blind hole 160. A closed end of the blind hole 160 is aligned with the boundary S. The light-absorption material 150 remaining on the openings O1 and O2 forms a plurality of light-blocking structures 191 and light-blocking structures 192, respectively. The light-blocking structures 191 may stagger with the light-blocking structures 192.

Figure 6F:
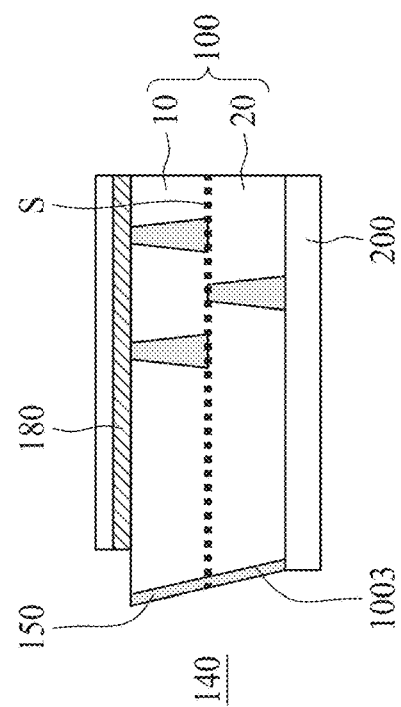
Figure 6F:
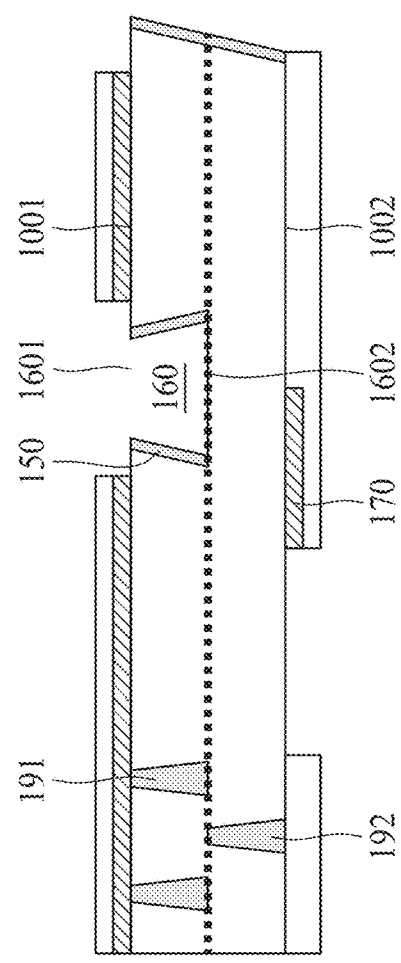

Referring to FIG. 6F, a light-reflecting layer 170 is formed on the surface 1001; and a conductive layer 180 is formed on the surface 1002. The light-reflecting layer 170 and the conductive layer 180 are formed by sputtering, chemical vapor deposition (CVD), physical vapor deposition (PVD), or other suitable process. The solder mask 200 is formed to cover the light-reflecting layer 170 and/or the conductive layer 180.

Figure 6G:
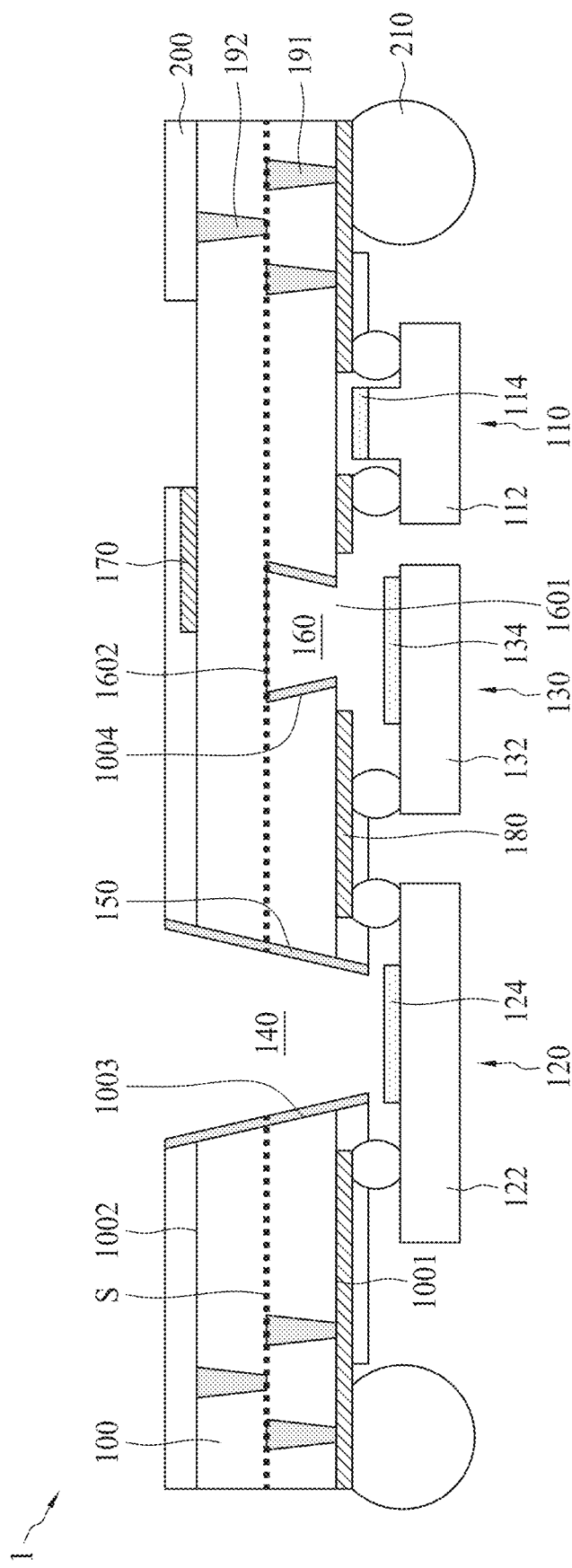

Referring to FIG. 6G, a portion of the solder mask 200 is removed, and a plurality of the bumps 210 are formed on an exposed surface of the conductive layer 180. Then, an emitter 110, a detector 120 and a detector 130 are attached to the surface 1001 of the substrate 100 to produce the optical package structure 1. The emitter 110, the detector 120 and the detector 130 may be attached to the bumps 210 by a flip chip process or other suitable processes. In some embodiments, the emitter 110, the detector 120 and the detector 130 may be attached to the bumps 210 in different steps and in an arbitrary sequence.

FIG. 7A, FIG. 7B, FIG. 7C, FIG. 7D, FIG. 7E, FIG. 7F and FIG. 7G illustrate various stages of a method for manufacturing an optical package structure 2 in accordance with some embodiments of the present disclosure.

Figure 7A:
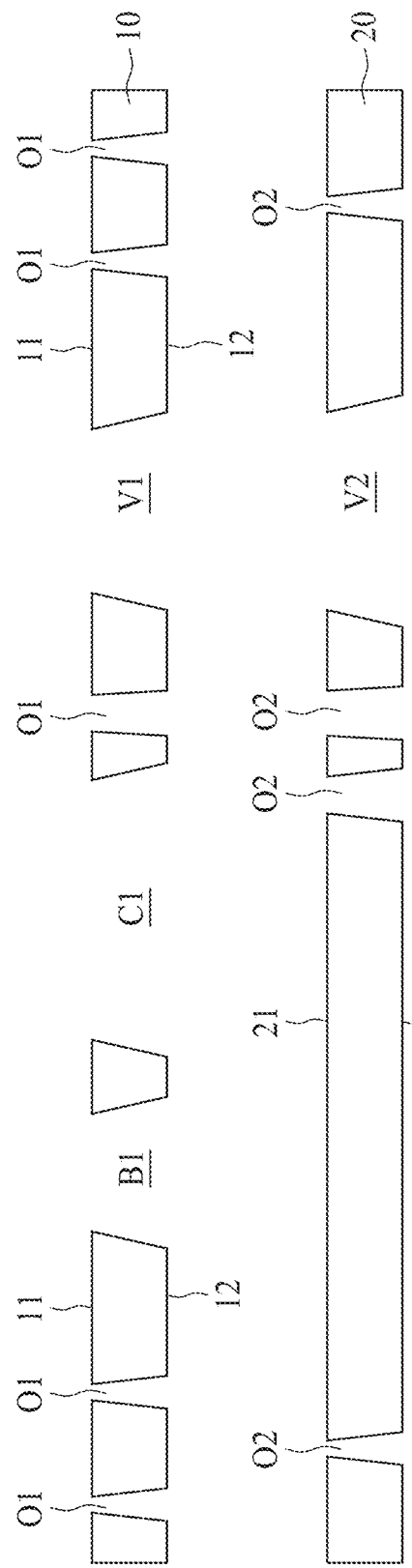
FIG. 7A, FIG. 7B, FIG. 7C, FIG. 7D, FIG. 7E, FIG. 7F and FIG. 7G illustrate various stages of a method for manufacturing an optical package structure in accordance with some embodiments of the present disclosure.

Referring to FIG. 7A, a first portion 10 and a second portion 20 are provided and patterned. The first portion 10 has a plurality of openings O1, a through hole B1, a through hole C1 and a through hole V1. The openings O1, the through holes B1, C1 and V1 extend from the surface 11 to the surface 12. The surface 20 has a plurality of openings O2 and a through hole V2. The openings O2 and the through hole V2 extend from the surface 21 to the surface 22. Each of the openings O1, the through holes B1, C1 and V1 has a larger aperture on the surface 12 and a smaller aperture on the surface 11; each of the openings O2 and the through hole V2 has a larger aperture on the surface 22 and a smaller aperture on the surface 21.

Figure 7B:
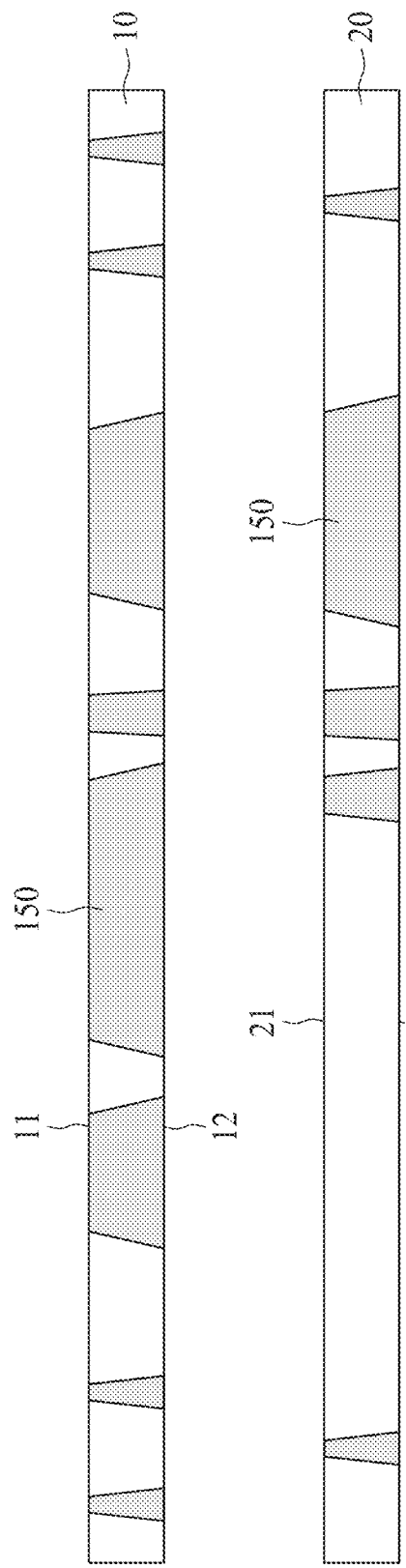

Referring to FIG. 7B, the light-absorption material 150 is filled into the openings O1, the through holes B1, C1 and V1; and the light-absorption material 150 is filled into the openings O2 and the through hole V2.

Figure 7C:
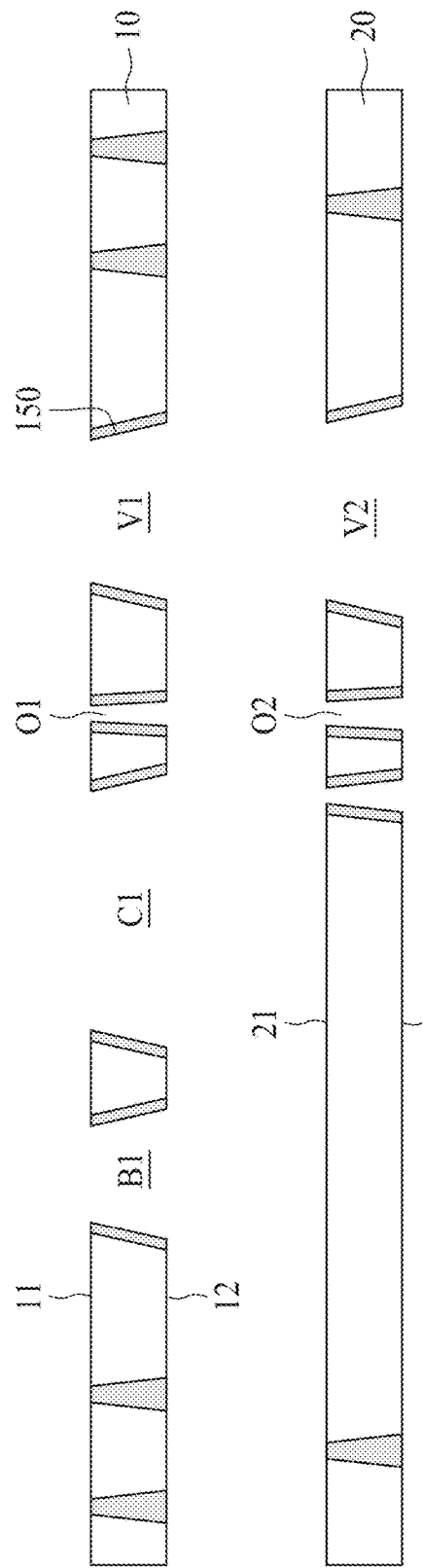

Referring to FIG. 7C, a portion of the light-absorption material 150 in the openings O1 and through holes B1, C1 and V1 is removed, such as by a drilling operation. A portion of the light-absorption material 150 remains on the side surfaces defined by the through holes B1 and V1. A portion of the light-absorption material 150 in the through hole V2 is removed by a drilling operation. A portion of the light-absorption material 150 remains on the side surfaces defined by the through hole V2.

Figure 7D:
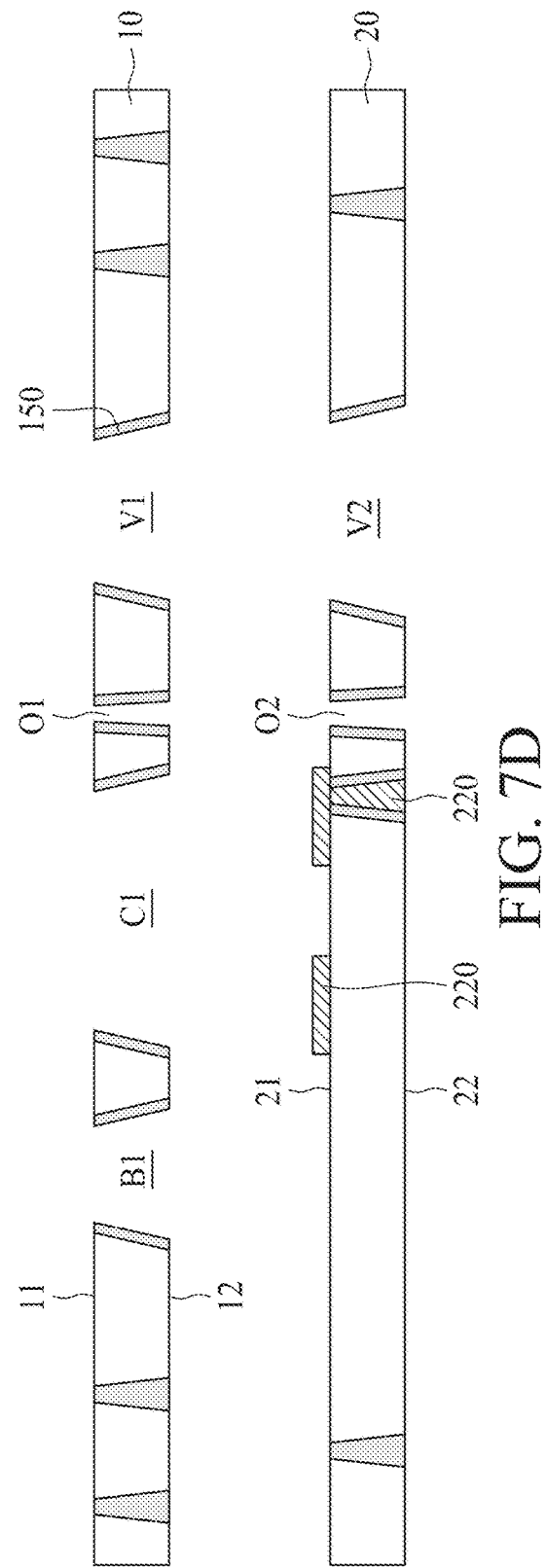

Referring to FIG. 7D, a conductive layer 220 is formed on the surface 21 of the second portion 20 and filled into some openings O2. The conductive layer 220 may be formed by a deposition process and a patterning process. The deposition process may include CVD process, PVD process, sputtering process, or other suitable processes. The patterning process may include lithography and etching and/or other suitable process. The etching process may include dry etching, wet etching process or other suitable process.

Figure 7E:
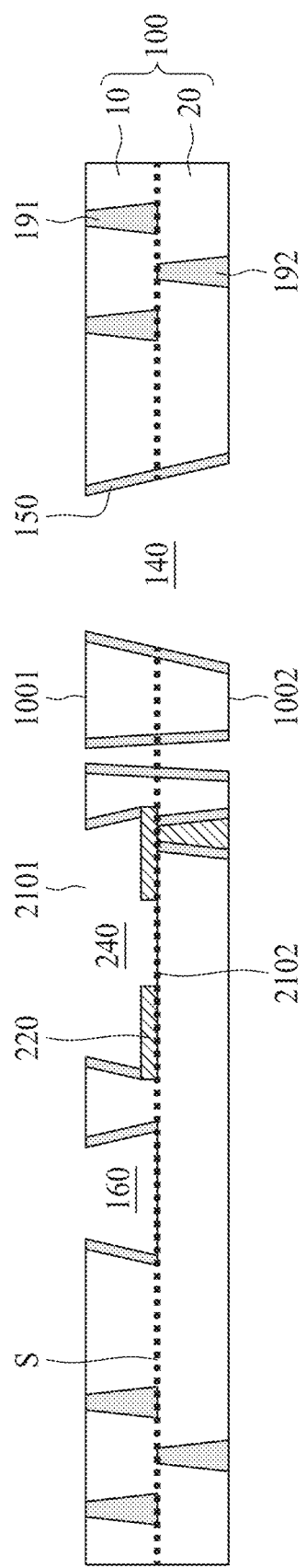

Referring to FIG. 7E, the first portion 10 and the second portion 20 are bonded to form the substrate 100. The surface 12 of the first portion 10 is attached to the surface 21 of the second portion 20, and a boundary S is formed. The through holes V1 and V2 form a via 140. The through hole B1 forms a blind hole 160. The through hole C1 forms a cavity 240. A closed end of the cavity 240 is aligned with the boundary S. The light-absorption material 150 remaining on the openings O1 and O2 form a plurality of light-blocking structures 191 and light-blocking structures 192, respectively.

Figure 7F:
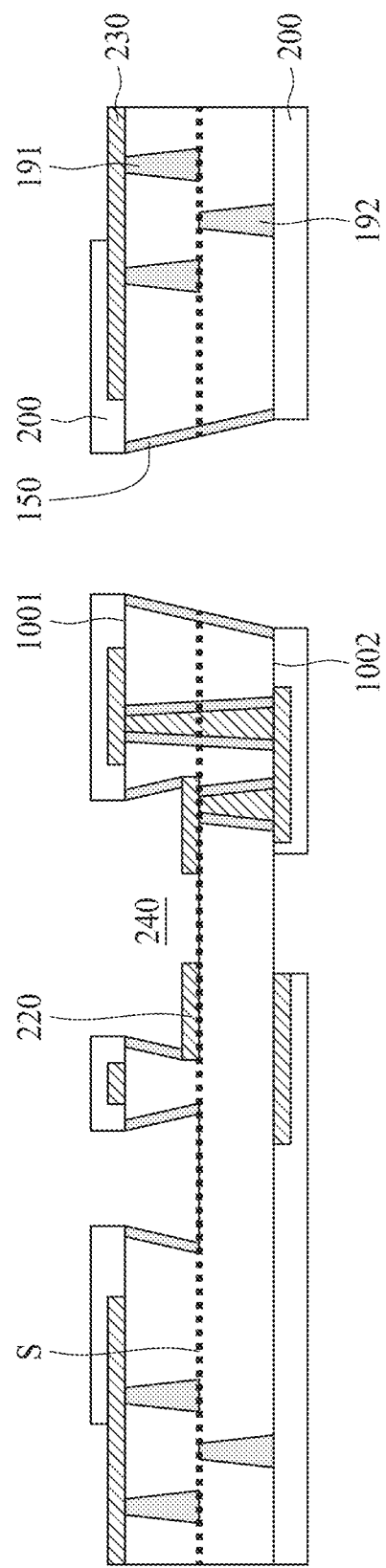

Referring to FIG. 7F, a conductive layer 230 is formed on the surface 1001, the surface 1002 to form a plurality of conductive pads and/or conductive wires. Then, a solder mask 200 is formed to cover the conductive layer 230.

Figure 7G:
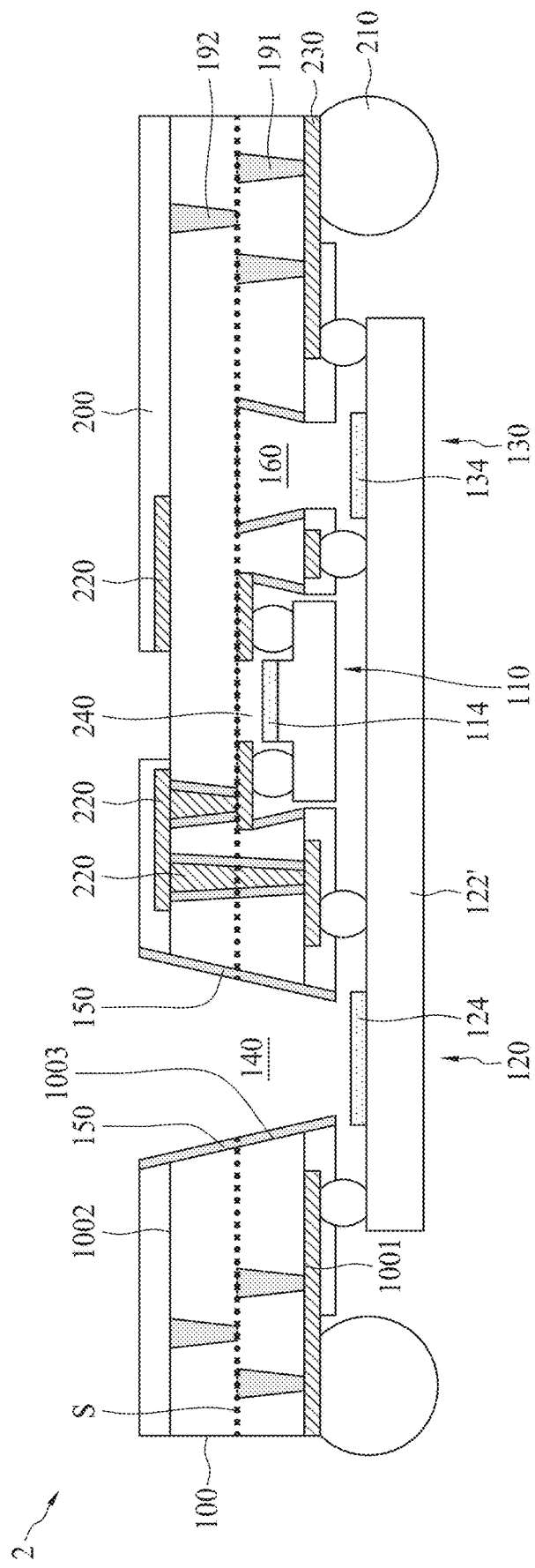

Referring to FIG. 7G, a portion of the solder mask 200 is removed and a plurality of bumps 210 are formed. A emitter 110 is attached to the substrate 100, and located in the cavity 240 of the substrate 100. A detector 120 and a detector 130 are attached to the surface 1001 of the substrate 100 to produce the optical package structure 2. The detector 120 and the detector 130 may attach to the substrate 100 after the emitter 110 is attached to the substrate 100. In this embodiment, since the detector 120 and the detector 130 use the same semiconductor substrate 122', the process of manufacturing the optical package structure 2 can be simplified.

FIG. 8A, FIG. 8B, FIG. 8C, FIG. 8D and FIG. 8E illustrate various stages of a method for manufacturing an optical package structure 3 in accordance with some embodiments of the present disclosure.

Figure 8A:
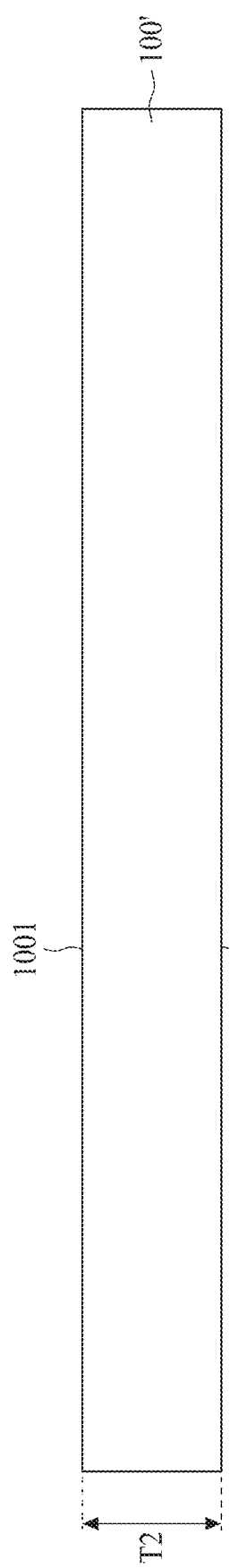
FIG. 8A, FIG. 8B, FIG. 8C, FIG. 8D and FIG. 8E illustrate various stages of a method for manufacturing an optical package structure in accordance with some embodiments of the present disclosure.

Referring to FIG. 8A, a substrate 100' is provided. The substrate 100' has a surface 1001 and a surface 1002 opposite to the surface 1001. The substrate 100' has a thickness T2. In some embodiments, the thickness T2 is in a range from about 0.1 mm to about 0.3 mm; the thickness T2 is in a range from about 0.3 mm to about 0.5 mm; the thickness T2 is in a range from about 0.5 mm to about 0.7 mm; the thickness T2 is in a range from about 0.7 mm to about 0.9 mm.

Figure 8B:
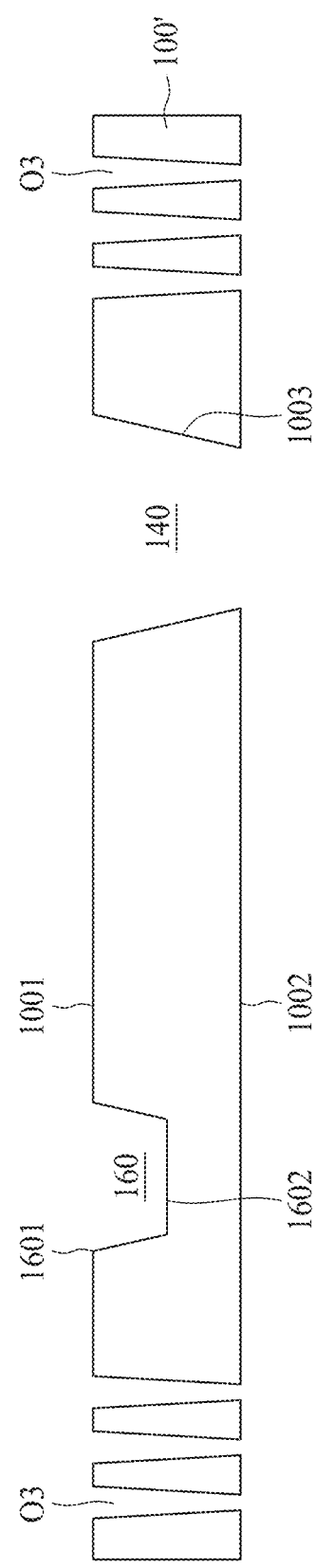

Referring to FIG. 8B, a patterning process is performed on the surface 1001 to form a plurality of openings O3, a via 140 and a blind hole 160. The openings O3 extend from the surface 1001 to the surface 1002. The blind hole 160 has an open end 1601 on the surface 1001 and a closed end 1602 between the surface 1001 and the surface 1002. The depth of the blind hole 160 may substantially be equivalent to half of the thickness T2; however, the present disclosure is not to be limited. A patterning process, for example, a mechanical drilling operation, a laser drilling operation, or an etching operation, is performed on the surface 1001. When a laser drilling operation is performed, a tapered cross section can be observed so that the blind hole 160 and the via 140 have a larger aperture on the surface 1001 and a smaller aperture on the surface 1002.

Figure 8C:
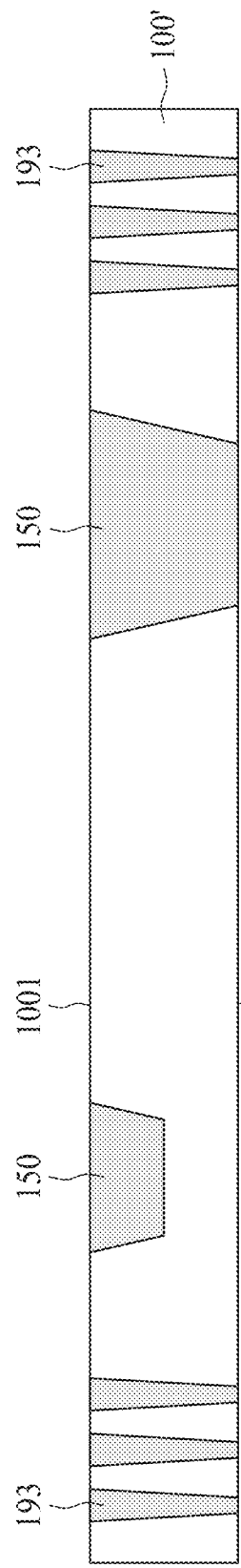

Referring to FIG. 8C, a light-absorption material 150 is filled into the openings O3, the via 140 and the blind hole 160. The light-absorption material 150 in the openings O3 forms a plurality of light-blocking structures 193.

Figure 8D:
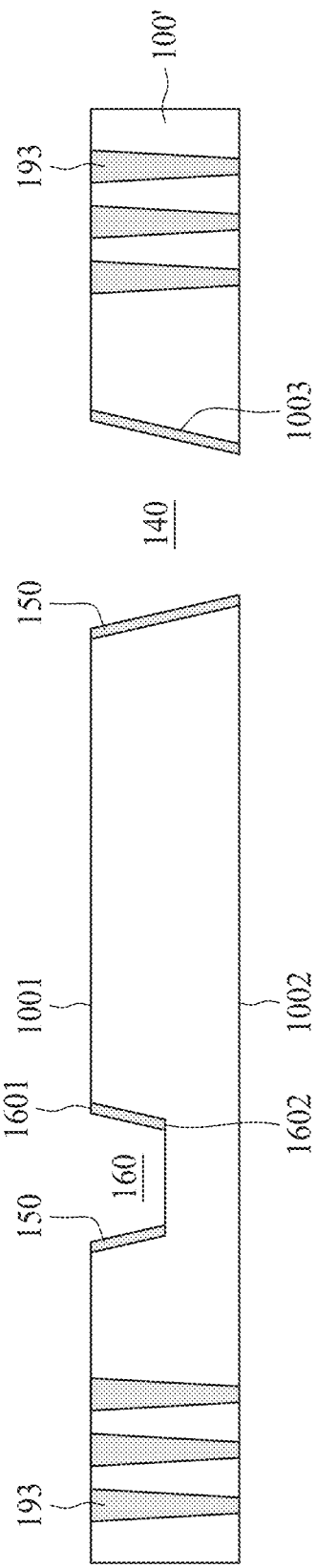

Referring to FIG. 8D, a portion of the light-absorption material 150 in the via 140 and in the blind hole 160 is removed, such as by a drilling operation, and a portion of the light-absorption material 150 remains on the surface 1003 of the substrate 100'. In addition, a portion of the light-absorption material 150 remains on the surface extending from the open end 1601 to the closed end 1602 of the blind hole 160.

Figure 8E:
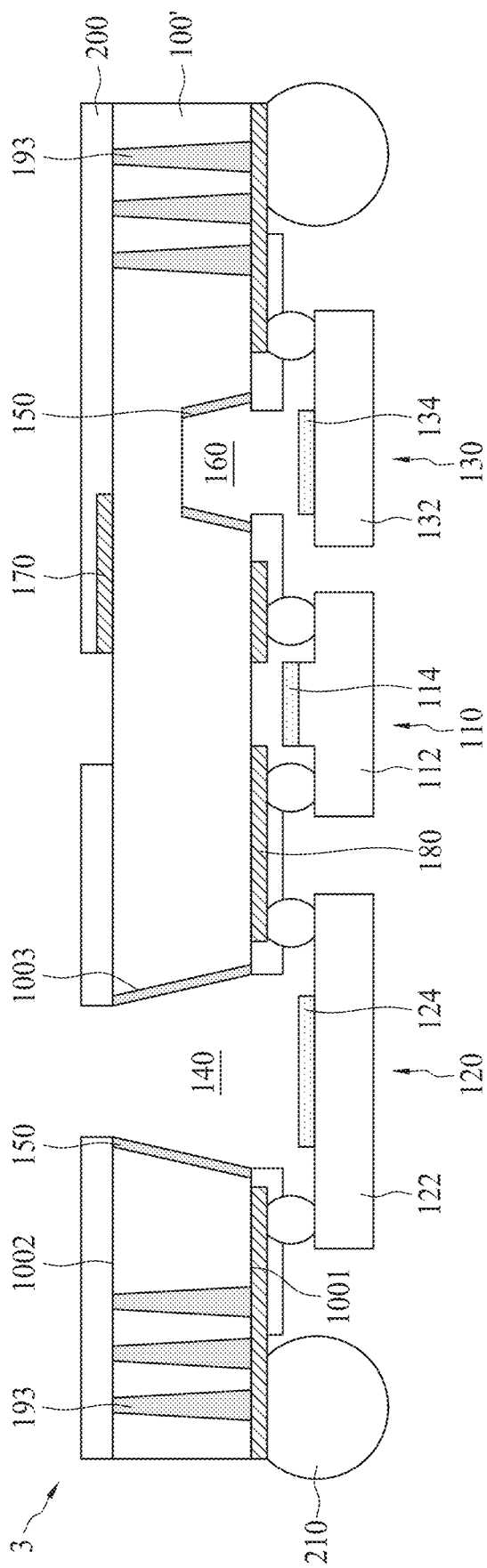

Referring to FIG. 8E, the emitter 110, the detector 120, and the detector 130 are attached to the surface 1001 of the substrate 100 to produce the optical package structure 3. The processes from FIG. 8D to FIG. 8E may be similar to those from FIG. 6E to FIG. 6G, and the details are omitted for brevity.

In this embodiment, since only one substrate is used to form the optical package structure 3, the thickness of the optical package structure 3 is reduced accordingly.

FIG. 9A, FIG. 9B, FIG. 9C, FIG. 9D and FIG. 9E illustrate various stages of a method for manufacturing an optical package structure 4 in accordance with some embodiments of the present disclosure.

Figure 9A:
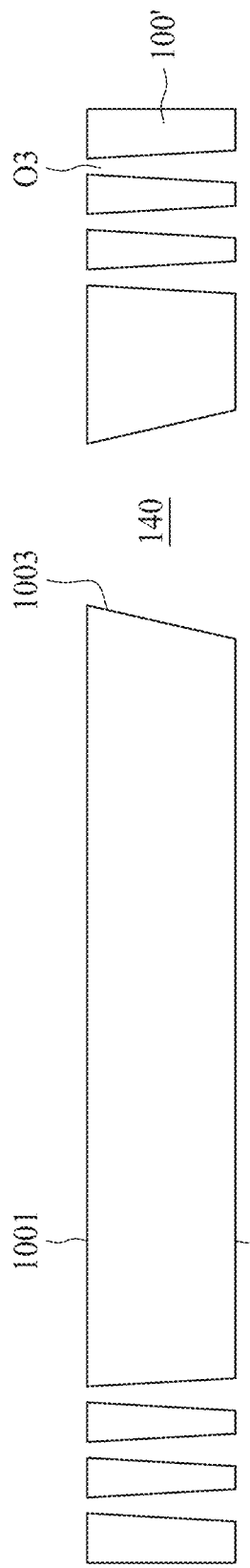
FIG. 9A, FIG. 9B, FIG. 9C, FIG. 9D and FIG. 9E illustrate various stages of a method for manufacturing an optical package structure in accordance with some embodiments of the present disclosure.

Referring to FIG. 9A, a substrate 100' is provided and patterned to form a via 140 and a plurality of openings O3. In this embodiment, the etching process is performed on the surface 1002. A patterning process, for example, a mechanical drilling operation, a laser drilling operation, or an etching operation, is performed on the surface 1002. When a laser drilling operation is performed, a tapered cross section can be observed so that each of the openings O3 and the via 140 can have a greater aperture on the surface 1002 and a smaller aperture on the surface 1001.

Figure 9B:
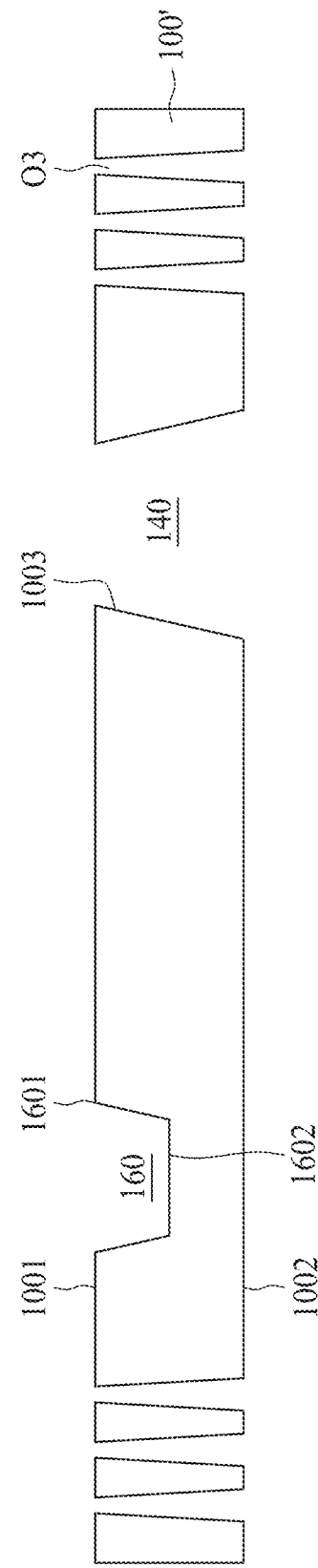

Referring to FIG. 9B, another patterning process is performed on the surface 1001 to form a blind hole 160. The blind hole 160 has a larger aperture on the surface 1001 and a smaller aperture at a closed end 1602 of the blind hole 160. In this embodiment, the via 140 and the blind hole 160 are formed in different processes; the sequence of formation of the blind hole 160 and the via 140 may be reversed, and the present disclosure is not intended to be limited thereto.

Figure 9C:
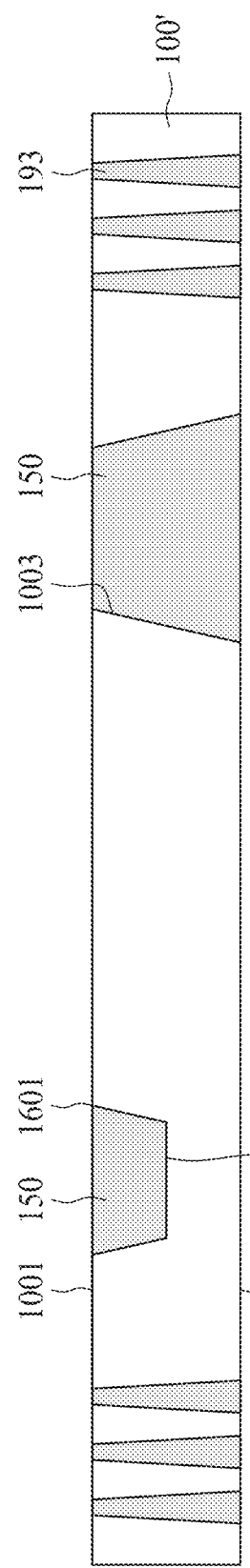

Referring to FIG. 9C, a light-absorption material 150 is filled into the openings O3, the via 140 and the blind hole 160. The light-absorption material 150 in the openings O3 forms a plurality of light-blocking structures 193. In this embodiment, one or more processes can be used to fill the light-absorption material 150 into the via 140 and the blind hole 160. For example, a portion of the light-absorption material 150 may be filled into the via 140 in one process first, and then another portion of the light-absorption material 150 may be filled into the via 140 in another one process later.

Figure 9D:
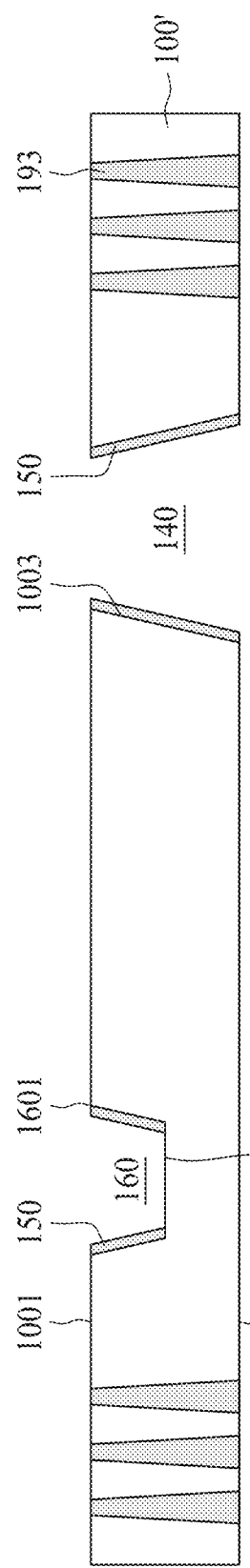

Referring to FIG. 9D, a portion of the light-absorption material 150 in the via 140 and blind hole 160 is removed, such as by a drilling operation, and a portion of the light-absorption material 150 remains on the surface 1003 of the substrate 100'. In addition, a portion of the light-absorption material 150 remains on the surface that extends from the open end 1601 to the closed end 1602 of the blind hole 160.

Figure 9E:
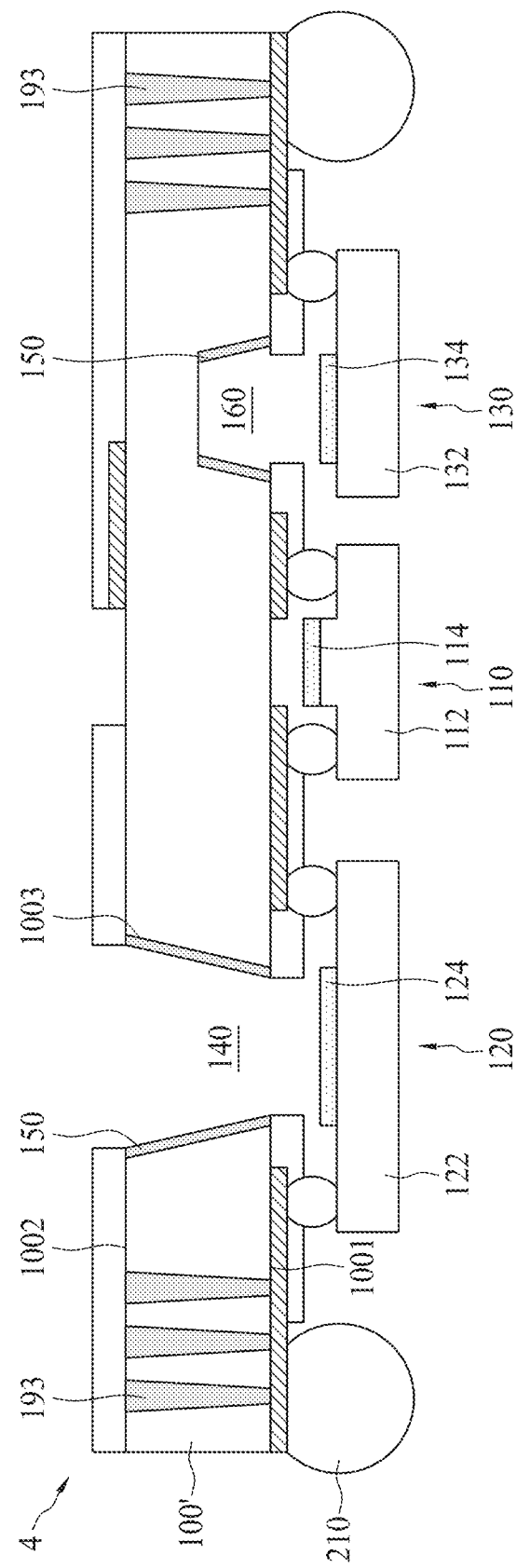

Referring to FIG. 9E, the emitter 110, the detector 120 and the detector 130 are attached to the surface 1001 of the substrate 100' to produce the optical package structure 4. The processes from FIG. 9D to FIG. 9E may be similar to those from FIG. 6E to FIG. 6G, and the details are omitted for brevity.

In some embodiments, the step shown in FIG. 9B can be omitted, and the remaining processes can be similar to or the same as FIG. 9A, FIG. 9C, FIG. 9D and FIG. 9E to produce the optical package structure 5. Since the blind hole is not formed, the process for forming the optical package structure 5 can be further simplified.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05° For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no exceeding 5 μm, no exceeding 2 μm, no exceeding 1 μm, or no exceeding 0.5 μm. A surface can be deemed to be substantially flat if a displacement between the highest point and the lowest point of the surface is no exceeding 5 μm, no exceeding 2 μm, no exceeding 1 μm, or no exceeding 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity exceeding approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optical package structure, comprising:
   a substrate having a first surface and a second surface opposite to the first surface, the substrate comprising a via defining a third surface extending from the first surface to the second surface;
   an emitter disposed on the first surface of the substrate;
   a first detector disposed on the first surface and aligned with the via of the substrate;
   a light-absorption material disposed on the third surface of the substrate; and
   a second detector disposed on the first surface of the substrate and adjacent to the emitter, wherein the substrate comprises a blind hole recessed from the first surface, and a light-receiving region of the second detector is aligned with the blind hole, and
   wherein the blind hole defines a first aperture at a closed end of the blind hole and a second aperture at an open end of the blind hole, the first aperture being greater than the second aperture.

2. An optical package structure, comprising:
   a substrate having a first surface and a second surface opposite to the first surface, the substrate comprising a via defining a third surface extending from the first surface to the second surface;
   an emitter disposed on the first surface of the substrate;
   a first detector disposed on the first surface and aligned with the via of the substrate;
   a light-absorption material disposed on the third surface of the substrate; and
   a second detector disposed on the first surface of the substrate and adjacent to the emitter,
   wherein the emitter is disposed between the first detector and second detector.

3. The optical package structure of claim 2, wherein the first detector and the second detector are on a semiconductor die.

4. An optical package structure, comprising:
   a substrate having a first surface and a second surface opposite to the first surface, the substrate comprising a via defining a third surface extending from the first surface to the second surface;
   an emitter disposed on the first surface of the substrate;

a first detector disposed on the first surface and aligned with the via of the substrate;

a light-absorption material disposed on the third surface of the substrate;

a second detector disposed on the first surface of the substrate and adjacent to the emitter; and a light-reflecting layer disposed on the second surface of the substrate, wherein a projection of the light-reflecting layer on the first surface is between the second detector and the emitter.

5. An optical package structure, comprising:

a substrate having a first surface and a second surface opposite to the first surface, the substrate comprising a via defining a third surface extending from the first surface to the second surface;

an emitter disposed on the first surface of the substrate;

a first detector disposed on the first surface and aligned with the via of the substrate; and a light-absorption material disposed on the third surface of the substrate;

a plurality of first light-blocking structures in the substrate and surrounding the via; and a plurality of second light-blocking structures in the substrate and surrounding the via, wherein each of the plurality of second light-blocking structures forms a blind via filled with the light absorption material.

6. The optical package structure of claim 1, wherein the via has a fifth aperture on the first surface and a sixth aperture on the second surface, and the fifth aperture is less than the sixth aperture.

7. The optical package structure of claim 2, wherein the substrate comprises a cavity recessed from the first surface, and the emitter is disposed in the cavity.

8. The optical package structure of claim 1, wherein the substrate comprises a first portion and a second portion, and a boundary of the first portion and the second portion substantially aligns with the closed end of the blind hole.

9. The optical package structure of claim 8, wherein the third surface comprises a step difference at the boundary of the first portion and the second portion.

10. The optical package structure of claim 8, wherein the light-absorption material is free from filling a center portion of the via.

11. The optical package structure of claim 10, further comprising:

a first light-blocking structure extending from the first surface of the substrate and terminating at the boundary of the first portion and the second portion.

12. The optical package structure of claim 11, further comprising:

a second light-blocking structure extending from the second surface of the substrate and terminating at the boundary of the first portion and the second portion.

13. The optical package structure of claim 12, wherein the first light-blocking structure is tapered along a first direction from the second surface toward the first surface of the substrate.

14. The optical package structure of claim 13, wherein the second light-blocking structure is tapered along the first direction.

15. The optical package structure of claim 14, further comprising:

a second light-absorption material disposed on a sidewall defining the blind hole.

16. The optical package structure of claim 15, wherein the second light-absorption material is free from filling a center portion of the blind hole.

* * * * *